(12) United States Patent
Meixner et al.

(10) Patent No.: US 11,724,373 B2
(45) Date of Patent: Aug. 15, 2023

(54) MOBILE PIN PULLING DEVICE

(71) Applicant: Liebherr-Werk Ehingen GmbH, Ehingen/Donau (DE)

(72) Inventors: Frank Meixner, Ehingen (DE); Matthias Waidmann, Ehingen (DE)

(73) Assignee: Liebherr-Werk Ehingen GmbH, Ehingen/Donau (DE)

( * ) Notice: Subject to any disclaimer, the term of this patent is extended or adjusted under 35 U.S.C. 154(b) by 162 days.

(21) Appl. No.: 17/233,394

(22) Filed: Apr. 16, 2021

(65) Prior Publication Data

US 2021/0323129 A1  Oct. 21, 2021

(30) Foreign Application Priority Data

Apr. 16, 2020  (DE) .................... 10 2020 110 406.5

(51) Int. Cl.
*B25B 27/02* (2006.01)
*G08B 21/18* (2006.01)
*G01R 19/165* (2006.01)

(52) U.S. Cl.
CPC ...... *B25B 27/026* (2013.01); *G01R 19/16566* (2013.01); *G08B 21/182* (2013.01)

(58) Field of Classification Search
CPC ........ B25B 27/04; B25B 27/03; B25B 27/026
See application file for complete search history.

(56) References Cited

U.S. PATENT DOCUMENTS

| 7,753,640 | B2 * | 7/2010 | Miyazaki | ............... B66C 23/62 |
| | | | | 212/177 |
| 9,009,938 | B2 * | 4/2015 | Noyes | ..................... B25B 27/02 |
| | | | | 254/99 |
| 9,815,674 | B2 * | 11/2017 | Foust | ..................... B25B 27/04 |
| 9,964,202 | B2 * | 5/2018 | Macik | .................. B25B 27/026 |
| 10,323,380 | B2 * | 6/2019 | Sasaoka | .................. E02F 3/627 |
| 11,105,342 | B2 * | 8/2021 | Williamson | .......... F04D 29/563 |
| 2009/0139948 | A1 * | 6/2009 | Holly | ...................... B66C 23/70 |
| | | | | 212/292 |
| 2010/0226710 | A1 * | 9/2010 | Yamasaki | ............... E02F 3/302 |
| | | | | 403/81 |
| 2014/0231374 | A1 * | 8/2014 | Foust | ..................... B66C 23/70 |
| | | | | 212/347 |
| 2019/0099868 | A1 | 4/2019 | Bennett et al. | |

(Continued)

FOREIGN PATENT DOCUMENTS

| CN | 106185644 A | 12/2016 |
| DE | 7506809 U | 12/1976 |
| DE | 29910335 U1 | 9/1999 |

(Continued)

OTHER PUBLICATIONS

Berkner, "How, Why, and When to apply electric motors to mobile hydraulic systems" 2008, Parker Hannifin 2008 Global Mobile Sales Meeting & Symposium, pp. 1-10 (Year: 2008).*

*Primary Examiner* — Jacob J Cigna
(74) *Attorney, Agent, or Firm* — McCoy Russell LLP

(57) ABSTRACT

The invention relates to a mobile, in particular portable, pin pulling device for pulling/inserting pins for connecting components of a construction machine, in particular of a crane, wherein the pin pulling device is designed in compact construction and has at least one electric drive having a rechargeable battery and a linear actuator drivable by the drive to move at least one pin.

10 Claims, 5 Drawing Sheets

(56) References Cited

U.S. PATENT DOCUMENTS

2020/0130313 A1* 4/2020 Ruch ................... B30B 15/166
2021/0205938 A1* 7/2021 Huesemann ............ B25B 27/04

FOREIGN PATENT DOCUMENTS

| DE | 19949797 A1 | 11/2000 |
| DE | 102014001736 A1 | 8/2015 |
| EP | 2241405 A1 | 10/2010 |

* cited by examiner

MOBILE PIN PULLING DEVICE

CROSS REFERENCE TO RELATED APPLICATION

The present application claims priority to German Patent Application No. 10 2020 110 406.5 filed on Apr. 16, 2020. The entire contents of the above-listed application is hereby incorporated by reference for all purposes.

TECHNICAL FIELD

The invention relates to a mobile, in particular portable, pin pulling device, or pin driving device, for pulling and/or inserting pins for the connection of components of a construction machine, in particular of a crane.

BACKGROUND AND SUMMARY

Individual components are as a rule pinned to one another when setting up construction machinery. Lattice pieces of a crane for setting up the boom system, in particular of lattice booms or counterbooms, boom extensions, and fly booms and their guying frames are prominent examples. The large number of lattice pieces that have geometries and construction shapes that are of the same structure or different are pinned to one another by means of fork-finger connections. The connection points of the lattice pieces first have to be brought into congruence for the insertion of the pins.

Since the lattice pieces are relatively heavy, an auxiliary crane has to pick them up and move them into the assembly position at which two bores coincide on an axis. Since an exact alignment is very difficult, pins are used that have a long cone at at least one side. Such a pin can then be introduced into the bore by a sufficiently high pressing force and the fork-finger connections can be aligned with one another. The required pressing force can be applied by a large hammer. For this purpose, however, the fitter has to be in direct proximity with the fork-finger connection, which represents a certain risk potential due to the strains present between the lattice pieces. Relative movements can in particular occur between the lattice pieces (relative pivoting of the lattice pieces with respect to one another or a translatory movement with respect to one another) on the removal of the second or last pin of a four-point pin connection. A fine adjustment of the weight of the lattice pieces, of the force received at the auxiliary crane, and the correct selection of the force introduction points must be considered in advance to minimize the risk.

Alternatively to this manual procedure, hydraulic pin pulling devices form the prior art today. They typically have larger dimensions and masses for the provision of the required high pinning energy, which makes their handling and transport to the construction site more difficult and time consuming. An example for a conventional pin pulling device is shown in FIG. 1. The solution comprises a carriage 1 on which a drive assembly 2 and a hydraulic pin pulling cylinder 3 are supported. The total carriage 1 has a length of approximately 2.5 meters and a height of 1.6 meters. The pin pulling cylinder itself is already typically more and 0.5 meters long and approximately 20 kilograms in weight.

To assemble the crane 30, the carriage 1 has to be moved into proximity with the fork-finger connection to be connected. The fitter subsequently takes up the pin pulling cylinder 3 and carries it to the lattice piece. After the required fixing to the lattice piece, the fitter returns to the carriage 1 and activates the drive assembly 2 in high pressure operation until the connection has been established. The pin pulling cylinder 3 is now installed at the next connection point; the carriage may have to be traveled prior to this.

A side representation of a known crane is shown in FIG. 2 whose boom system comprises a plurality of pinned lattice pieces 20. The arrows mark the individual pinning points. Since each pinning point comprises four respective pin connections, a total of 76 pins has to be inserted for the installation of the crane shown. It is obvious that the time effort for the assembly of such a crane by means of the known pin pulling devices is very time consuming.

There is therefore the desire for an improved solution that in particular considerably simplifies the handling of such a pin pulling device.

This object is achieved by a mobile pin pulling device in accordance with the features of claim 1. Advantageous embodiments of the pin pulling device are the subject of the dependent claims.

It is proposed in accordance with the invention to design a mobile pin pulling device in a compact manner of construction. This is made possible by an electric drive having an integrated rechargeable battery. Such a drive assembly is considerably smaller in construction and lighter in comparison with the proposals known from the prior art. In addition, the device is autonomous and at least temporarily manages without an external energy supply. A linear actuator for moving at least one pin is driven by means of the electric drive. The resulting manual device combines the drive assembly and the actuator in a compact device that can be carried and operated without problem by the operator.

A use of the mobile pin pulling device is sensible whenever pins have to be inserted or pulled with a high force effort. This is in particular the case with construction machinery where individual components are pinned by means of pinning connections during the assembly of the construction machine. The use of the mobile pin pulling device is preferable on the erection and dismantling of boom systems comprising individual lattice pieces. A sensible use can equally be named of pinning crawler carriers to an undercarriage of a construction machine.

In accordance with a preferred embodiment of the invention, the linear actuator is designed in the form of a cylinder, in particular of a hydraulic cylinder. The implementation by means of a pneumatic cylinder is equally conceivable. The pin can be selectively inserted or pulled by the rod movement.

The energy conversion takes place by means of an interposed pump, in particular a hydraulic pump or a pneumatic pump, that is driven by the electric drive and that generates the required pressure level for the feed of the cylinder.

The installed electric motor is preferably only designed for a single direction of rotation and is furthermore only operated at a constant speed. Transmission components or a frequency inverter can correspondingly be dispensed with. The control of the direction of movement and/or the movement speed can instead be implemented hydraulically or pneumatically, preferably by one or more way valves that are connected between the pump and the cylinder.

The installed actuator in the form of a cylinder is ideally designed as a two-stroke cylinder. Since approximately the same hydraulic pressure is required for both directions of movement with a two-stroke cylinder, it can operate approximately equally in both setting directions.

The pin pulling device has to be fixed to the machine structure so that the linear actuator can apply the required movement energy to the pin. The pin pulling device comprises at least one suitable connection point for this purpose. A fork having an inserted pin is conceivable as a suitable connection point for the pin pulling device. The pin pulling device can be suspended at an open eyelet of the machine structure in a fast and uncomplicated manner by means of the pin. A suitable abutment surface, preferably a shoulder of the housing of the pin pulling device, is equally conceivable that can be inserted into a matching groove of the machine structure and thereby likewise provides a fixing of the pin pulling device in the direction of pressing or pulling of the actuator. The shoulder can specifically be designed as an annular elevated portion on the periphery of the actuator.

The reception means of the actuator for the indirect or direct reception of the pin can be designed in the form of a claw that is seated at the free end of the piston rod. The pin can, for example, be designed with an introduced rod having a reception head, for example a screw. The head can be engaged around by means of the claw and a pressing and pulling force can thus be applied to the pin.

A control unit that is arranged locally at the pin pulling device can be provided to control/operate the pin pulling device. The pin pulling device can be switched on by the control unit and the operating mode, i.e. the application of a pulling or pressing force, and optionally the actuation speed of the actuator can be set by the control unit.

Since, as described in the introduction, the region around the pinning point can represent a risk for the operator on the pulling or inserting, it is preferred to expand the pin pulling device by a possibility for a remote control. The pin pulling device can have a suitable communication interface for connecting a mobile remote control for this purpose. A wired communication link having an external remote control is conceivable, but a radio-based interface is preferred. The operator can initially fix the pin pulling device to the machine structure without risk in the region of the pinning point due to this expansion and can subsequently start the force application and the process of the pin pulling or inserting at a sufficient distance by means of the remote control. The remote control can be a dedicated remote control of the pin pulling device, but the use of commercial communication devices such as smartphones, tablets, laptops, etc. is also conceivable.

It is proposed to equip the pin pulling device with an integrated safety device to monitor the forces that occur during the pin actuation by the actuator. Since there is a specific relationship between the power consumption of the electric motor and the force to be applied by the actuator to actuate the pin, the force applied by the cylinder is, for example, proportional to the current flow through the electric motor, the pressing or pulling force currently applied by the actuator can be determined by a power-dependent parameter of the motor, in particular of the motor current. A comparison of the determined electrical parameters with associated limit values is sensible. On an exceeding of the limit value, the pin pulling device can generate a user message. This message can be displayed to the user acoustically, visually, or haptically.

The safety device can sensibly be equipped with a mechanism that blocks the local operation of the pin pulling device via the integral control unit when the force to be applied by means of the actuator, in particular the detected power value/current value of the electric motor exceeds a defined limit value. On an exceeding of the limit value, it is assumed that the required force application signifies an increased risk potential. The pin pulling device is ideally then only actuable by remote control via the communication interface.

A hydraulic/pneumatic protective device such as a pressure relief valve can be installed to protect the pin pulling device and/or the components to be installed from forces that are too high.

BRIEF DESCRIPTION OF THE FIGURES

Further advantages and properties of the invention will be explained in more detail in the following with reference to an embodiment shown in the Figures. There are shown.

DETAILED DESCRIPTION

Figure 1:
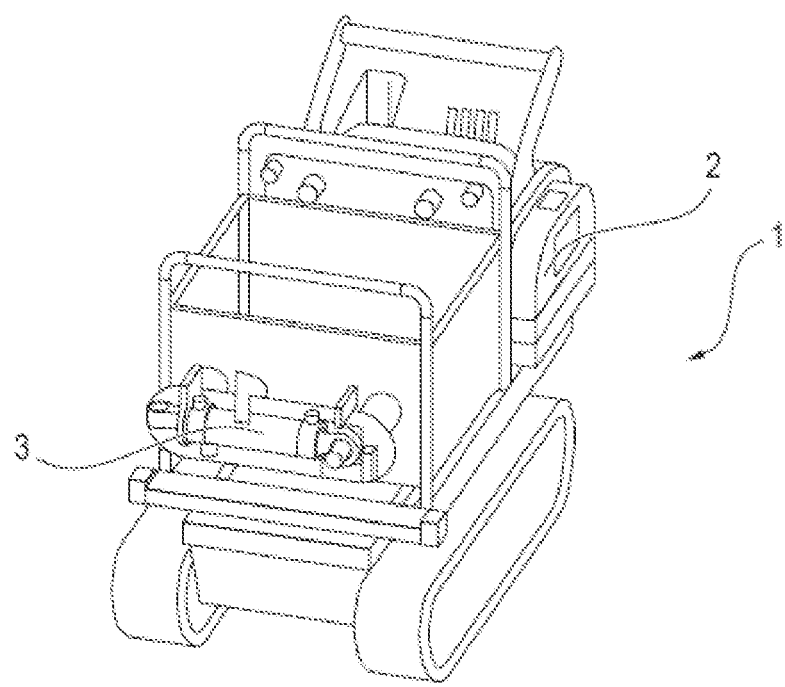
FIG. 1: a pin pulling device in accordance with the prior art.
Figure 2:
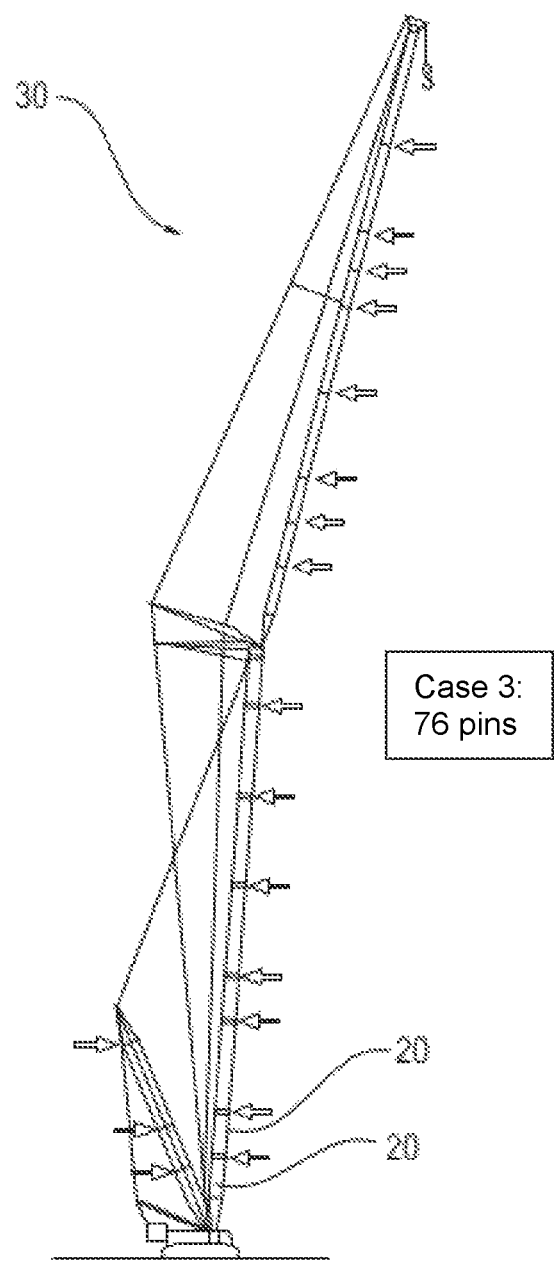
FIG. 2: a side view of an exemplary crane to illustrate the required pin connection points.
Figure 3:
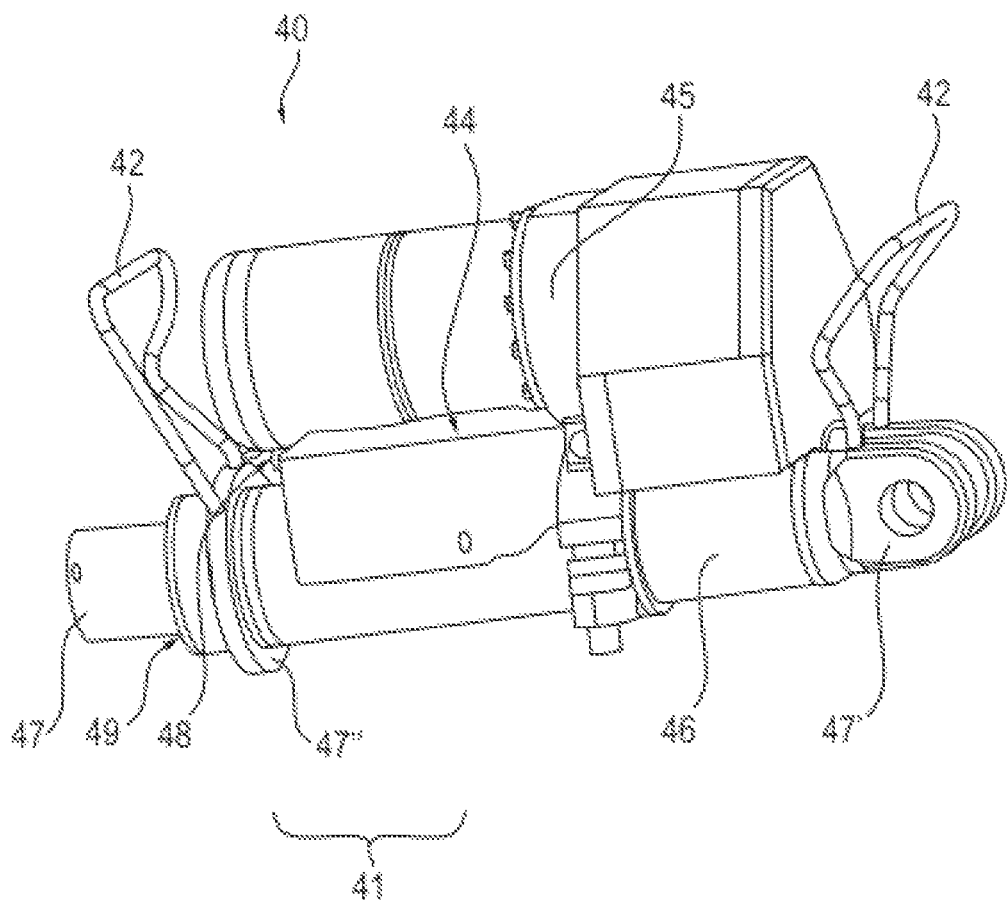
FIG. 3: the solution in accordance with the invention for a mobile pin pulling device in a compact construction.

FIG. 3 shows the innovative solution in accordance with the invention of the mobile pin pulling device. The manual device 40 shown comprises an electric drive having a rechargeable battery 41. The electric drive drives a hydraulic pump 45 that conveys hydraulic oil in dependence on the direction of rotation and the speed of the engine. The electric motor is only configured for one direction of movement at a constant speed.

The hydraulic pump 45 conveys the hydraulic oil by the built up pressure into a hydraulic cylinder 46 having a piston rod 49 by whose linear movement a pin can be inserted or pulled. The hydraulic cylinder 46 is designed as a two-stroke cylinder that works approximately the same in both adjustment directions.

To change the direction of movement or setting speed of the piston rod 49 of the cylinder 46, the pump 45 is connected to the cylinder 46 by a 4/3 way valve. The setting direction and optionally the setting speed can be varied by the valve position. The operator can trigger a valve actuation via an integral control unit 44 of the manual device 40. The activation of the electric motor also takes place via the control unit 44. The user can pick up and hold the manual device 40 by the handle 42.

Figure 4:
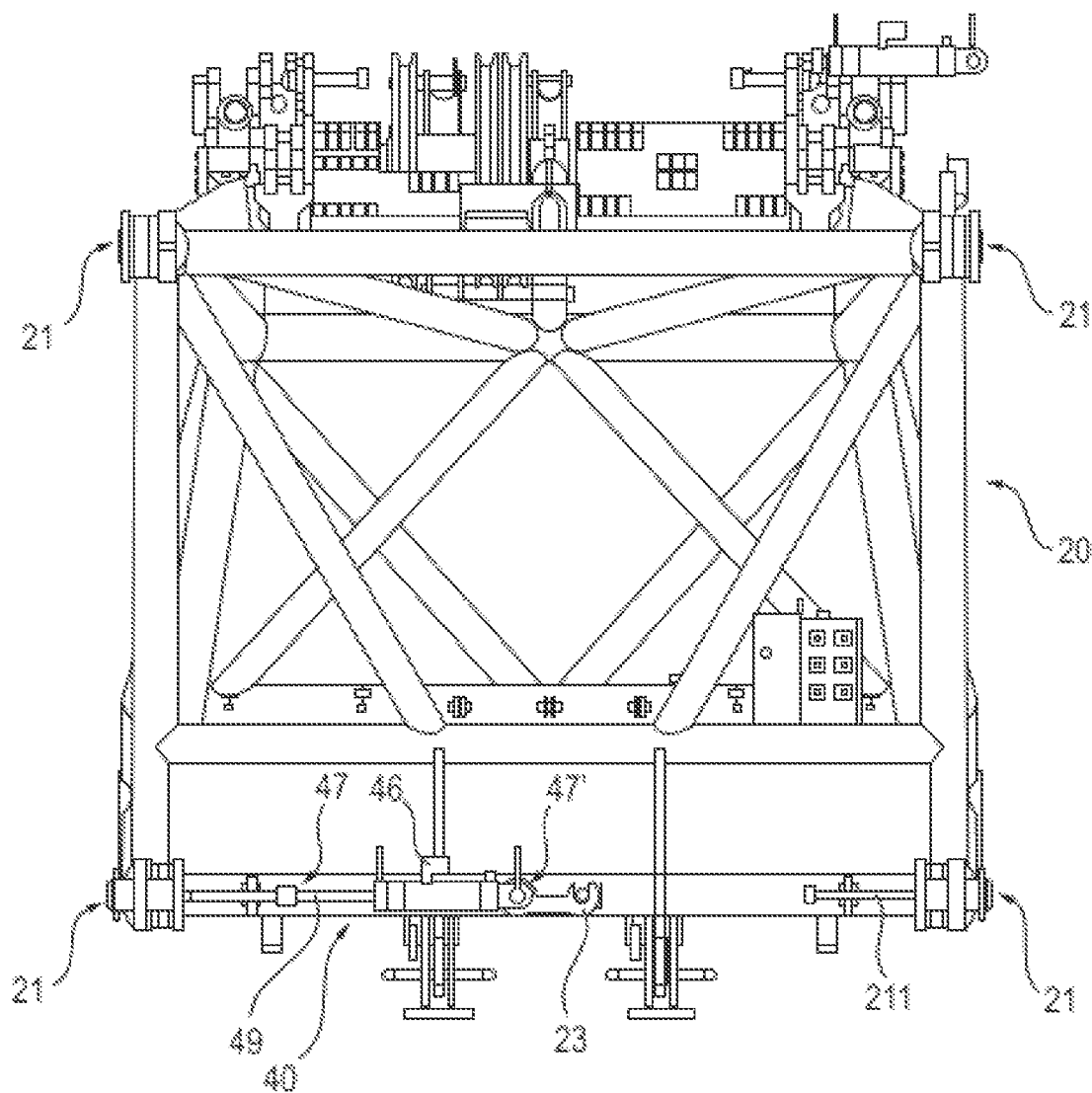
FIG. 4: a plan view of the pinning points of a lattice piece with an inserted pin pulling cylinder.

The pin pulling device 40 works both when pressed and pulled, i.e. pins can be inserted and pulled. The device 40 should previously have been fixed to the machine structure in the region of the pinning point for an ideal force transmission onto the pin. At least one connection point 47, 47', 47" is provided at the manual device 40 for this purpose. A first connection point 47' is a fork molded to the cylinder end for the transverse support of a pin not shown in FIG. 3. The manual device 40 can, for example, be hung at an open eyelet 23 of the machine structure by means of the pin, for example, to fix the manual device 40 against the generated linear movement of the cylinder 46. FIG. 4 shows a lattice piece 20 having the pinning points 21. The manual device 40 is used here to actuate the pinning 21 at the bottom left.

Figure 5:
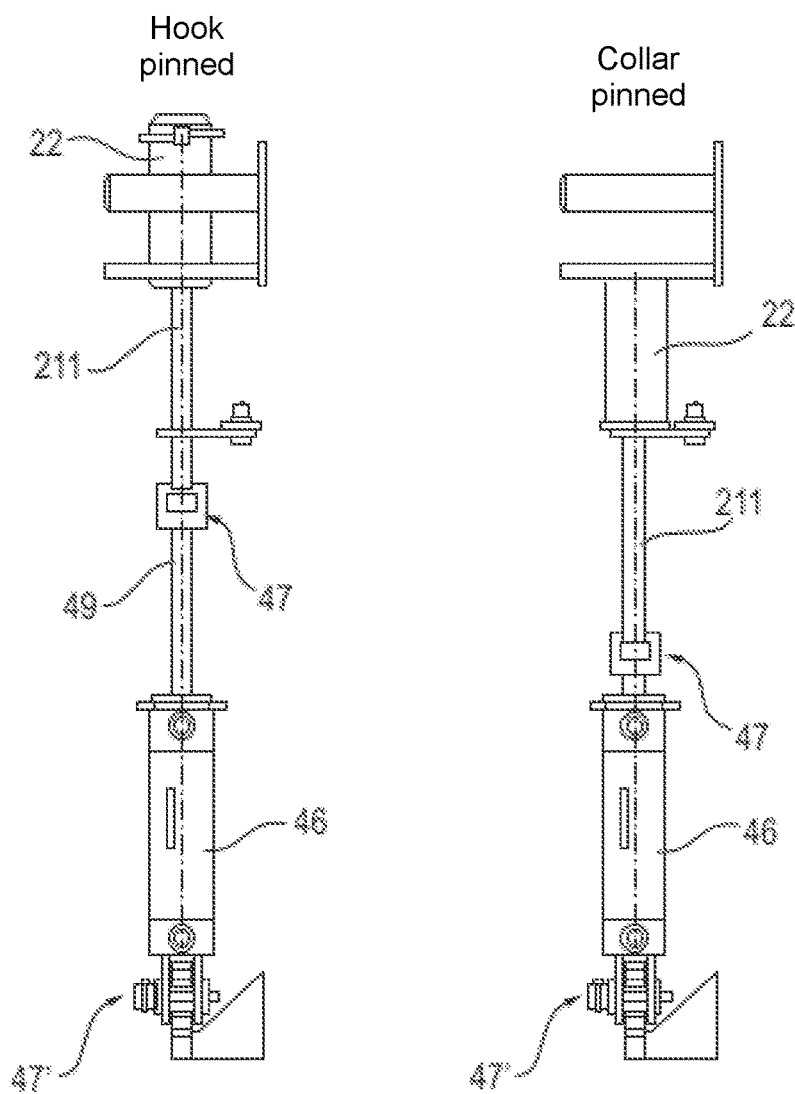
FIG. 5: two illustrations of the pin pulling device in accordance with the invention with a received pin.

The piston rod 49 has a claw 47 at its extensible end to receive a screw 211 introduced into the pin 22 to be moved. This can be seen, for example, in the FIG. 5, wherein the left illustration shows the pin pulling device 40 with an extended piston rod 49 and thus an inserted pin 22 and the right illustration shows the retracted piston rod 49 and a pulled pin 22.

Figure 6:
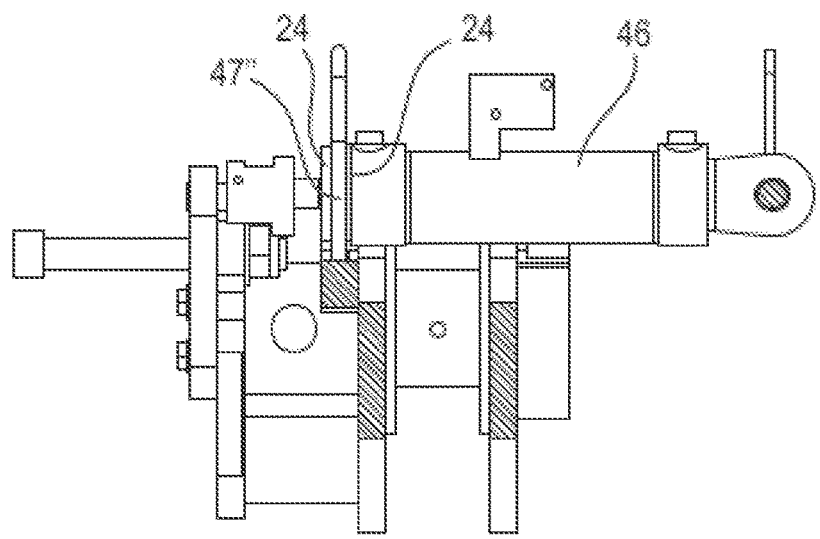
FIG. 6: a further illustration of the pin pulling device in accordance with the invention used at the crane structure.

Additionally or alternatively to the fork 47' for the connection of the manual device 40 to the machine structure, a shoulder 47" can also be provided that can be seen in the embodiment shown of FIG. 6. The shoulder is formed by a ring that is placed on the cylinder housing of the cylinder 46 and that is placed in an annular groove 24 provided for this purpose on the fixing to the manual device 40 to the machine structure and thus enables a force transmission.

The two working spaces of the cylinder 46 are connected to the pump 45 via hydraulic lines that are not shown or are inwardly disposed. The hydraulic lines are laid as favorably as possible at the cylinder 46 to avoid damage on the handling or on the placing down. The piston rod 49 of the cylinder 46 is not specifically guided and can be rotated about its longitudinal axis by hand since the connection point 47 can be direction oriented and a manual alignment is thus necessary to receive the pin 22. A knurled surface of the piston rod head facilitates the handling of the piston rod 49 and prevents a sliding off on rotation.

The control unit 44 of the manual device 40 cannot always be used due to the risk potential for users. For this reason, the manual device 40 comprises an integral safety device having a communication interface, whereby a radio-based remote control of the manual device 40 via an external remote control becomes possible. The internal communication module of the manual device 40 can receive commands from the remote control and can execute them.

A safe pairing of the remote control and the manual device 40 is provided to preclude an incorrect operation. The radio range of the remote control is so large that the fitter can depart from the risk-prone region of the pinning point 21.

A sensor for measuring the current taken up by the electric drive is installed in the manual device 40. Since the electric motor is directly connected to the pump 45, the hydraulic force applied by the cylinder 46 is proportional to the current flow in the electric motor. If the current flow exceeds a defined threshold value, the safety device triggers an acoustic alarm. The operator receives the feedback from the alarm that the pin 22 is very stiff. There is thus the risk that the lattice pieces 20 connected to the bolt 22 move after its removal. In this case, the fitter has to use the remote control and be outside the risk zone. There can in particular be the possibility for safety reasons that the safety device blocks the local control unit 44 in this case and only permit an operation of the manual device 40 by the remote control.

The alarm takes place solely in dependence on the current flow and also sounds on the control of the manual device 40 via the remote control. A second pressure stage, the so-called low pressure stage, as with previous solutions, is thus superfluous.

The movement of the piston rod 49 of the cylinder 46 takes place for so long until the operator input is ended. At least one pressure relief valve is furthermore provided as customary with hydraulic controls. The movement is thus also ended on an exceeding of the limit pressure defined by the valve to protect the components involved in the fork-finger connection 22 from too great a force effect with resulting damage. Since most cases are specifically designed, the maximum stroke of the piston rod 49 is as a rule coordinated with the provided path of the pin 22 to be covered.

The invention claimed is:

1. A mobile pin pulling device for pulling/inserting pins for connecting components of a construction machine, wherein the pin pulling device has at least one electric drive having a rechargeable battery and a linear actuator drivable by the drive to move at least one pin,
   wherein the electric motor is only operable in one direction of rotation and at a constant speed,
   wherein a means for detecting a power-dependent parameter of the electric motor is provided, wherein the means for detecting the power-dependent parameter include an integral safety device is provided that monitors the determined power-dependent parameter or the current value for an exceeding of one or more threshold values, and
   wherein the safety device is designed such that it prevents an operation of the pin pulling device by means of a local control unit and only permits a remote control if the power-dependent parameter or the current value exceeds a defined threshold value.

2. The mobile pin pulling device in accordance with claim 1, wherein the direction of movement and/or movement speed of the at least one linear actuator, is controllable by means of a valve or valve arrangement.

3. The mobile pin pulling device in accordance with claim 1, wherein a local control unit is provided at the pin pulling device and/or a communication module is provided for communication with an external remote control.

4. The mobile pin pulling device in accordance with claim 1, wherein the safety device generates and emits an alarm signal on an exceeding of a threshold value.

5. The mobile pin pulling device in accordance with claim 1, wherein at least one pressure relief valve is provided.

6. The mobile pin pulling device in accordance with claim 1, wherein the electromechanical actuator comprises at least one hydraulic or pneumatic cylinder that is fed with hydraulic/pneumatic energy by at least one pump driven by means of the electric drive.

7. The mobile pin pulling device in accordance with claim 6, wherein the at least one cylinder is designed as a two-stroke cylinder.

8. The mobile pin pulling device in accordance with claim 1, wherein the pin pulling device has at least one connection point for fixing to the machine structure and that the actuator has a reception means that comprises a claw for receiving the pin.

9. The mobile pin pulling device in accordance with claim 8, wherein the connection point is a fork having a pin for hanging the pin pulling device to an open eyelet of the machine structure and/or is a shoulder for insertion into a groove of the machine structure.

10. The mobile pin pulling device in accordance with claim 8, wherein the reception means is a claw for taking up a reception rod, introduced into the pin.

* * * * *